United States Patent
Schwarz et al.

(10) Patent No.: US 6,617,904 B1
(45) Date of Patent: Sep. 9, 2003

(54) ELECTRONIC CIRCUIT WITH CLOCK GENERATING CIRCUIT

(75) Inventors: Patrik Schwarz, Zürich (CH); Stefan Studerus, Spreitenbach (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/709,263

(22) Filed: Nov. 9, 2000

(30) Foreign Application Priority Data

Nov. 9, 1999 (EP) .............................. 99203744

(51) Int. Cl.[7] ................................. H03K 3/00
(52) U.S. Cl. ................... 327/295; 327/91; 327/327; 327/43
(58) Field of Search ................ 327/43, 91, 94, 327/141, 218, 291, 293, 299, 295

(56) References Cited

U.S. PATENT DOCUMENTS

| | | | |
|---|---|---|---|
| 4,980,577 A | * 12/1990 | Baxter ........................ 327/198 |
| 5,341,031 A | 8/1994 | Kinoshita et al. ............ 307/269 |
| 5,532,633 A | * 7/1996 | Kawai ......................... 327/299 |
| 5,793,236 A | 8/1998 | Kosco ......................... 327/218 |
| 6,072,336 A | * 6/2000 | Yamaguchi .................. 327/91 |
| 6,271,702 B1 | * 8/2001 | Stansell ....................... 327/295 |

FOREIGN PATENT DOCUMENTS

EP  0785624 A1  7/1997

* cited by examiner

Primary Examiner—Timothy P. Callahan
Assistant Examiner—Linh Nguyen
(74) Attorney, Agent, or Firm—Aaron Waxler

(57) ABSTRACT

An electronic circuit has a clock input for receiving an input clock signal. A clock processing circuit derives derived clock signals from the input clock signal, for example by frequency dividing the input clock signal. A dual edge triggered sampling circuit samples the derived clock signals at both rising and falling edges of the input clock signal. The sampled clocks are thus synchronized and are used to control operation of processing circuitry.

6 Claims, 1 Drawing Sheet

ELECTRONIC CIRCUIT WITH CLOCK GENERATING CIRCUIT

BACKGROUND OF THE INVENTION

The invention relates to an electronic circuit with a clock signal generator circuit.

U.S. Pat. No. 5,341,031 describes a clock generator circuit. This clock generator circuit divides an input clock signal. The input clock signal clocks a latch that samples the divided signal once for every period of the input clock signal. Thus, a derived clock signal is produced that has a well-defined phase relation with respect to the input clock signal. However, in this circuit works only for derived clock signal that have a frequency equal to or less than half the frequency of the input clock signal.

European patent application No. 785624 also describes a clock generator circuit. In this clock generator circuit the input clock signal is processed to generate a derived clock signal, for example by clock windowing. This processing causes delays, which give the derived clock signal an ill-defined phase relation with respect to the input clock signal. The circuit of EP 785624 overcomes this problem using a resynchronized version of the derived clock signal.

To perform resynchronization, the circuit of EP 785624 contains two resynchronization circuits, a first one constituted by two D-latch stages and a second one constituted by a single D-latch stage. The resynchronization circuits latch the derived clock signal at points in time that are defined by the input clock signal. The resynchronization circuits produce two signals that are synchronous with the input clock signal, but out of phase with respect to one another by a semi-period of the input clock signal. An EXOR circuit forms a logical EXOR of these two signals. The EXOR circuit produces output pulses when the logic level of the derived clock signal changes. The duration of the output pulses is half a period of the input clock signal, that is, the same duration as the duration of pulses of the input clock signal. The derived clock signal has half the frequency of the input clock signal, and so the output of the EXOR has the same frequency as the input clock signal.

It is desirable to generate any kind of resynchronized derived signals with a minimum pulse duration that is the same as that of the input clock signal. However, the technique of EP 785624 applies only to specific signals that can be generated with an EXOR of two phase-shifted signals.

SUMMARY OF THE INVENTION

It is an object of the invention to provide for an electronic circuit that is able to generate arbitrary derived clock signals with a minimum pulse duration that is equal to that of the input clock signal.

The electronic circuit according to the invention is described in claim 1. According to the invention, the clock generator circuit uses a dual edge triggered flip-flop to sample the derived clock signal. Dual edge triggered flip-flops are known per se, for example from U.S. Pat. No. 5,793,236. The dual edge triggered flip-flop in the circuit according to the invention samples the derived clock signal both at the rising and the falling edges of the input clock signal. Thus, pulses of the derived clock signal with a duration down to half a period of the input clock signal are sampled correctly.

As a result, the sampling circuits works properly when the frequency of the derived clock signal is equal to that of the input clock signal.

An embodiment of the electronic circuit according to the invention contains a plurality of dual edge triggered flip-flops each for producing a respective sampled derived clock signal. These dual edge triggered flip-flops receive the input clock in common. As a result, all the sampled derived clock signals are synchronized. At least one of the derived clock signals may have the same frequency as the input clock signal. Thus, the sampled version of that derived clock signal will have the same delay with respect to the input clock signal as the other sampled versions of derived clock signals (a delay due to the operation dual edge triggered flip-flop). This sampled version can be used instead of the input clock signal to control processing circuits in combination with the other sampled versions of derived clock signals. Preferably, the dual edge triggered flip-flops are located close to the processing circuits that use these signal (i.e. closer than to the circuit that derives the clock signals), so as to eliminate mutually different propagation delays.

BRIEF DESCRIPTION OF THE DRAWING

These and other advantageous aspects of the electronic circuit according to the invention will be described in more detail using the following figures.

DESCRIPTION OF THE PREFERRED EMBODIMENTS

Figure 1:
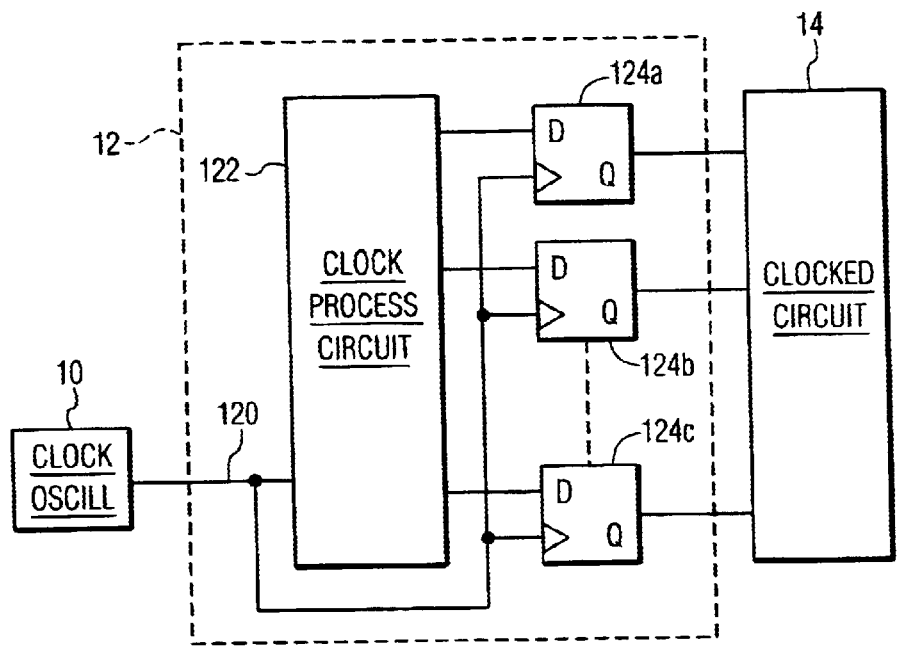
FIG. 1 shows an electronic circuit with a clock derivation circuit.

FIG. 1 shows an electronic circuit containing a clock oscillator 10, a clock derivation circuit 12 and a clocked circuit 14. The clock derivation circuit 12 is coupled between the clock oscillator and the clocked circuit 14. The clocked circuit 14 is for example a data processor or a digital signal processor, which needs various clock signals for example at different frequencies, or with different phases, or gated during certain time windows. Clock oscillator 10, clock derivation circuit 12 and clocked circuit 14 may be part of as single integrated circuit, but they may also be distributed over different integrated circuit.

The clock derivation circuit contains a main clock input 120, a clock processing circuit 122 and a number of dual edge triggered flip-flops 124a–c. The clock processing circuit 122 and the dual edge triggered flip-flops 124a–c have clock inputs coupled to the main clock input 120. The clock processing circuit 122 has clock outputs coupled to data inputs of the dual edge triggered flip-flops 124a–c.

Dual edge triggered flip-flops are known per se. A dual edge triggered flip-flop copies the signal value at its input to its output at rising and falling edges of its clock signal. A dual edge triggered flip-flop is realized for example using a first and second single edge triggered flip-flop (not shown). The first flip-flop holds its signal values and passing its input signal to its output when the clock signal is logic high and low respectively. The second flip-flop does the same, but at opposite values of the clock signal. These flip-flops are followed by a multiplexing circuit which passes alternately the output from one flip-flop and the other flip-flop, whichever holds its output value at the time of passing that output. It will be appreciated that this is but one very simple implementation of a dual edge triggered flip-flop. The skilled person will be able to select the most suitable implementation for a particular circuit from the literature.

The dual edge triggered flip-flops 124a–c are preferably located close to clocked circuit 14, for example on the same integrated circuit chip if the circuit is distributed over different chips, or in the same chip block as the clocked circuit 14. This ensures that there is little variation in delay from the outputs of the dual edge triggered flip-flops 124a–c to the clocked circuit.

Figure 2:
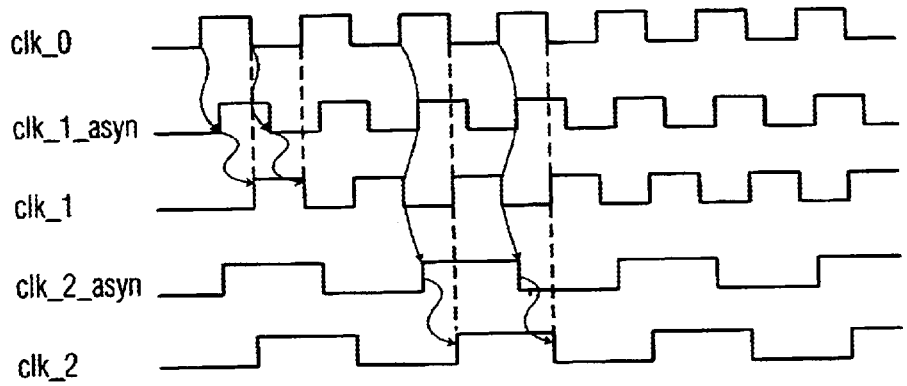
FIG. 2 shows signals occurring during operation of the circuit.

FIG. 2 shows signals occurring during use of the circuit. A first trace CLK_0 shows the input clock signal received at the main clock input 120. Traces CLK_1_asyn and CLK_2_asyn show derived clock signals at the outputs of clock processing circuit 122, derived from input clock signal CLK_0. By way of example the derived clock signal CLK_1_asyn has the same frequency as the input clock signal CLK_0 and the derived clock signal CLK_2_asyn has half the frequency of the input clock signal CLK_0. The phase relation between the input clock signal CLK_0 on one hand and the derived clock signals CLK_1_asyn and CLK_2_asyn on the other hand is determined by delays occurring in clock processing circuit 122. In general, there is no guarantee that edges in the derived clock signals CLK_1_asyn and CLK_2_asyn coincide.

Traces CLK_1 and CLK_2 show sampled versions of the derived clock signals CLK_1_aysn and CLK_2_aysn. The derived clock signals CLK_1_aysn and CLK_2_aysn are sampled both at rising and falling edges of the input clock signal CLK_0, because the flip-flops 124a–c are dual edge triggered flip-flops. As a result, edges in the sampled clock signals CLK_1, CLK_2 coincide with one another. Sampled clock signal CLK_1 has the same frequency as the input clock signal CLK_0.

What is claimed is:

1. An electronic circuit comprising a clock derivation circuit having
   a clock input for receiving an input clock signal,
   a clock processing circuit coupled to the clock input for deriving a derived clock signal from the input clock signal,
   a plurality of dual edge triggered sampling circuits each with a signal input coupled to an output of the clock processing circuit and a sampling clock input coupled to the clock input, for sampling the derived clock signal at both rising and falling edges of the input clock signal, and wherein each of the plurality of dual edge triggered sampling circuits have an output coupled directly to a clocked circuit, and each of the plurality of dual edge triggered sampling circuits have an input coupled to a respective output of the clock processing circuit,
   wherein the value of the derived clock signal is captured at both edges of the input clock signal, and wherein the sampled result goes high at an edge of the input clock signal when the derived clock signal is high and goes low at an edge of the input clock signal when, the derived clock signal is low.

2. An electronic circuit according to claim 1, the clock processing circuit having a plurality of outputs, the dual edge triggered sampling circuit comprising a corresponding plurality of dual edge triggered flip-flops, each having an input coupled to a respective one of the outputs of the clock processing circuit, each dual edge triggered flip-flop having a sampling clock input, the sampling clock inputs being coupled in common to the clock input.

3. An electronic circuit according to claim 1, where a frequency of at least one output clock signal produced by the clock processing circuit at least one of the outputs of the clock processing circuit is equal to a frequency of the input clock signal.

4. The electronic circuit as claimed in claim 1, wherein the plurality of dual edge triggered sampling circuits and the clocked circuit are located on the same integrated circuit.

5. An electronic circuit comprising a clock derivation circuit having
   a clock input for receiving an input clock signal,
   a clock processing circuit coupled to the clock input for deriving a derived clock signal from the input clock signal,
   a plurality of dual edge triggered sampling circuits each with a signal input coupled to an output of the clock processing circuit and a sampling clock input coupled to the clock input, for sapling the derived clock signal at both rising and falling edges of the input clock signal, and wherein each of the plurality of dual edge triggered sampling circuits have an output coupled directly to a clocked circuit, and each of the plurality of dual edge triggered sampling circuits have an input coupled to a respective output of the clock processing circuit,
   wherein a frequency of the derived clock signal produced by the clock processing circuit is equal to a frequency of the input clock signal.

6. An electronic circuit comprising a clock derivation circuit having
   a clock input for receiving an input clock signal,
   a clock processing circuit coupled to the clock input for deriving a derived clock signal from the input clock signal,
   a plurality of dual edge triggered sampling circuits each with a signal input coupled to an output of the clock processing circuit and a sampling clock input coupled to the clock input, for sampling the derived clock signal at both rising and falling edges of the input clock signal, and wherein each of the plurality of dual edge triggered sampling circuits have an output coupled directly to a clocked circuit, and each of the plurality of dual edge triggered sampling circuits have an input coupled to a respective output of the clock processing circuit,
   wherein all sampled derived clock signals have a leading edge that is synchronized with an edge of the input clock signal.

\* \* \* \* \*